(12) United States Patent
Lee et al.

(10) Patent No.: US 11,307,719 B2
(45) Date of Patent: Apr. 19, 2022

(54) TOUCH PANEL AND TOUCH DEVICE

(71) Applicant: LG DISPLAY CO., LTD., Seoul (KR)

(72) Inventors: Yangsik Lee, Gyeonggi-do (KR); JiHyun Jung, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/098,559

(22) Filed: Nov. 16, 2020

(65) Prior Publication Data

US 2021/0064166 A1    Mar. 4, 2021

Related U.S. Application Data

(63) Continuation of application No. 16/193,179, filed on Nov. 16, 2018, now Pat. No. 10,871,863.

(30) Foreign Application Priority Data

Nov. 20, 2017    (KP) .................. 10-2017-0154456

(51) Int. Cl.
*G06F 3/044*    (2006.01)
*H01L 51/52*    (2006.01)
(Continued)

(52) U.S. Cl.
CPC ............ *G06F 3/044* (2013.01); *G06F 3/0418* (2013.01); *G06F 3/0443* (2019.05); *G06F 3/0446* (2019.05); *G06F 3/0448* (2019.05); *H01L 27/323* (2013.01); *H01L 27/3276* (2013.01); *H01L 51/5237* (2013.01);
(Continued)

(58) Field of Classification Search
CPC ...... G06F 3/044; G06F 3/0448; G06F 3/0412; G06F 2203/04107; G06F 2203/04111; G06F 2203/04112; H01L 27/323
See application file for complete search history.

(56) References Cited

U.S. PATENT DOCUMENTS

2012/0098762 A1    4/2012  Kim
2012/0182230 A1    7/2012  Wang et al.
(Continued)

FOREIGN PATENT DOCUMENTS

CN    102760019 A    10/2012
CN    104407755 A    3/2015
(Continued)

*Primary Examiner* — Priyank J Shah
(74) *Attorney, Agent, or Firm* — Birch, Stewart, Kolasch & Birch, LLP

(57) ABSTRACT

A display device includes a light-emitting device; an encapsulation layer disposed on the light-emitting device; an insulating layer on the encapsulation layer; a plurality of first touch sensors on an upper surface of the insulating layer, and arranged in a first direction; a plurality of second touch sensors on the upper surface of the insulating layer, and arranged in a second direction intersecting the first direction; and a discharge pattern disposed between the encapsulation layer and the insulating layer, and overlapping an area between a first touch sensor of the plurality of first touch sensors and a second touch sensor of the plurality of second touch sensors. Further, a first end of the discharge pattern is connected to one of the first touch sensor and the second touch sensor through a contact hole of the insulating layer.

9 Claims, 12 Drawing Sheets

(51) Int. Cl.
  _H01L 27/32_   (2006.01)
  _G06F 3/041_   (2006.01)
  _H05K 9/00_    (2006.01)

(52) U.S. Cl.
  CPC ....... _H01L 51/5253_ (2013.01); _H05K 9/0079_ (2013.01); _G06F 3/0412_ (2013.01); _G06F 2203/04107_ (2013.01); _G06F 2203/04111_ (2013.01); _G06F 2203/04112_ (2013.01)

(56) References Cited

U.S. PATENT DOCUMENTS

| | | |
|---|---|---|
| 2013/0279063 A1 | 10/2013 | Yoo |
| 2014/0055383 A1 | 2/2014 | Kim et al. |
| 2014/0098304 A1 | 4/2014 | Kim et al. |
| 2015/0205407 A1 | 7/2015 | Kim |
| 2015/0234492 A1 | 8/2015 | Lu et al. |
| 2016/0315284 A1 | 10/2016 | Jeon |
| 2017/0045979 A1 | 2/2017 | Li et al. |
| 2017/0277328 A1 | 9/2017 | Kurasawa et al. |
| 2018/0039360 A1* | 2/2018 | Akimoto ............. H01L 27/3276 |
| 2019/0051708 A1 | 2/2019 | Jeong et al. |

FOREIGN PATENT DOCUMENTS

| | | |
|---|---|---|
| CN | 104765497 A | 7/2015 |
| CN | 105677117 A | 6/2016 |
| CN | 106098724 A | 11/2016 |
| CN | 106933398 A | 7/2017 |
| CN | 107329641 A | 11/2017 |
| EP | 2796971 A1 | 10/2014 |

\* cited by examiner

TOUCH PANEL AND TOUCH DEVICE

CROSS REFERENCE TO RELATED APPLICATIONS

This Application is a Continuation of U.S. patent application Ser. No. 16/193,179 filed on Nov. 16, 2018 (now U.S. Pat. No. 10,871,863 issued on Dec. 22, 2020), which claims the priority benefit under 35 U.S.C. § 119(a) to Korean Patent Application No. 10-2017-0154456 filed in the Republic of Korea on Nov. 20, 2017, all of which are hereby expressly incorporated by reference into the present application.

BACKGROUND OF THE INVENTION

1. Field of the Invention

Embodiments of the present disclosure relate to a touch panel and a touch device.

2. Description of the Related Art

As society develops into an information society, demand for a display device for displaying images is increasing, and various types of display devices such as a liquid crystal display device, a plasma display device, and an organic light-emitting display device are being utilized. In order to provide more various functions to a user, such display devices provide functions of recognizing a user's touch on a display panel and performing an input process based on the recognized touch.

For example, by disposing a touch sensor on a display panel and sensing a change in capacitance caused by a user's touch on the display panel, the presence or absence of the user's touch and a touch position on the display panel can be sensed. In addition, methods of sensing a change in capacitance by sensing a touch include a method of applying touch driving signals having the same voltage level to respective touch sensors and sensing a change in self-capacitance caused by a touch, and a method of applying touch driving signals having different voltage levels to adjacent touch sensors and sensing a change in mutual capacitance generated at the time of touch.

Here, in the method of sensing the change in mutual capacitance, a phenomenon may occur in which an electric field is formed between adjacent touch sensors and charges are concentrated to a portion where the electric field is formed. As the charges are concentrated, the repulsive force between the touch sensors in a specific area increases.

Thus, the touch sensors may be damaged in the portion where the repulsive force between the touch sensors increases as described above, and in that, due to the damage of the touch sensors, a touch driving signal may not be transmitted or touch sensing may not be performed in a specific region.

SUMMARY OF THE INVENTION

An aspect of embodiments of the present disclosure is to provide a touch panel and a touch device, in which touch sensors can be prevented from being damaged due to a phenomenon in which charges are concentrated to a portion where an electric field is formed in a structure that senses a touch using a change in capacitance.

An aspect of embodiments of the present disclosure is to provide a touch panel and a touch device having a structure for providing an electrostatic discharge path from a touch sensor disposed in the touch panel or the touch device.

In addition, an aspect of embodiments of the present disclosure is to provide a touch display panel and a touch display device to which the above-mentioned touch panel or touch device is applied.

In one aspect, embodiments of the present disclosure provide a touch panel including: a plurality of first touch sensors disposed in a touch sensing area; a plurality of second touch sensors disposed in the touch sensing area and disposed on a same layer as the first touch sensors; one or more first connection patterns disposed on a same layer as the first touch sensors, disposed between two first touch sensors of the plurality of first touch sensors, and configured to connect the two first touch sensors to each other; one or more second connection patterns disposed on a layer different from the first touch sensors, configured to at least partially overlap the first connection pattern, and configured to connect two second touch sensors of the plurality of second touch sensors to each other; and one or more discharge patterns disposed on a layer different from the first touch sensor, configured to overlap an area between the first touch sensor and the second touch sensor, and having one end connected to the first touch sensor or the second touch sensor.

In another aspect, embodiments of the present disclosure provide a touch panel including: an insulating layer; a plurality of bridge metals disposed under the insulating layer; a plurality of first touch metals disposed on an upper surface of the insulating layer so as to be arranged in one direction; and a plurality of second touch metals disposed on the upper surface of the insulating layer and arranged in a direction intersecting the one direction to be separated from each other. One or more first bridge metals among the plurality of bridge metals are connected to two adjacent second metals among the plurality of second metals through a hole formed in the insulating layer, and one or more second bridge metals among the plurality of bridge metals are connected, at one ends thereof, to the first touch metals or the second touch metals through a hole formed in the insulating layer.

In another aspect, embodiments of the present disclosure provide a touch device including: a panel on which a plurality of first touch sensors and a plurality of second touch sensors are disposed; one or more first connection patterns disposed on a same layer as the first touch sensors and the second touch sensors, and configured to connect the two adjacent first touch sensors to each other; one or more second connection patterns disposed on a layer different from the first touch sensors and the second touch sensors, and configured to connect the two adjacent second touch sensors to each other; and one or more discharge patterns disposed on a layer different from the first touch sensors and the second touch sensors. One portion of each of the discharge patterns overlaps at least one of the first touch sensors, a remaining portion of each of the discharge patterns overlaps at least one of the second touch sensors, and one end of each of the discharge patterns is connected to at least one of the first touch sensors or the second touch sensors.

According to embodiments of the present disclosure, it is possible to provide a touch panel and a touch device having a structure in which a discharge pattern is provided at a portion where an electric field between touch sensors is formed, so that static electricity can be discharged from the portion where the electric field is formed.

According to embodiments of the present disclosure, by providing a touch sensor, disposed in a touch panel or a touch device, with a discharge structure, it is possible to prevent the touch sensor from being damaged due to a phenomenon in which charges are concentrated to a specific area.

In addition, according to embodiments of the present disclosure, by applying the above-mentioned touch panel and touch device to a display device, which is capable of touch sensing, it is possible to reduce the occurrence of defects in the touch sensor in the display device.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
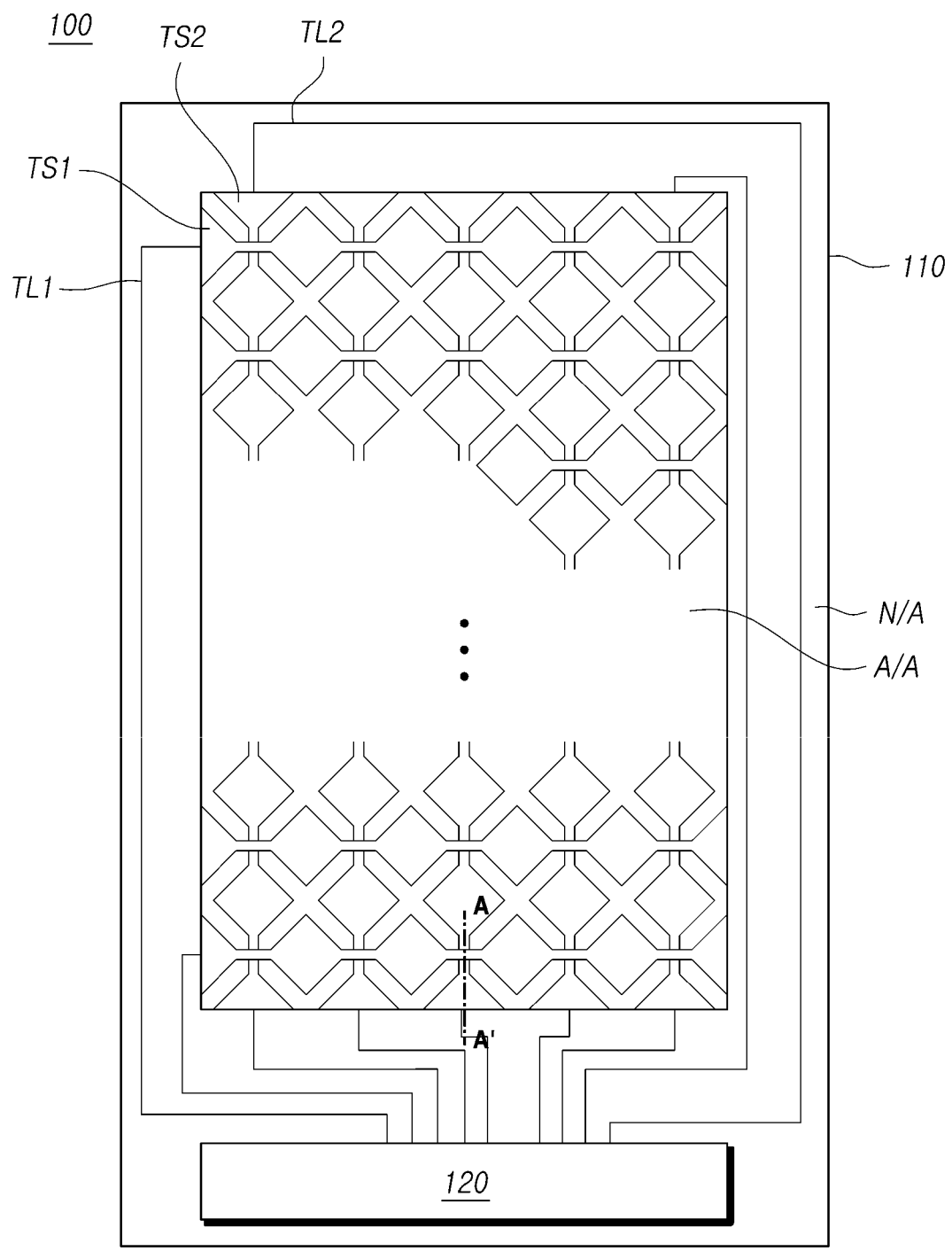
FIG. 1 is a view illustrating a schematic configuration of a touch display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a view illustrating a schematic configuration of a touch display device 100 according to embodiments of the present disclosure. Embodiments of the present disclosure will be described focusing on a touch display device 100 having a touch sensing function. However, a touch panel or a touch device is also included in the scope of the embodiments of the present disclosure when the touch panel or the touch device provides the touch sensing function.

Referring to FIG. 1, the touch display device 100 according to the embodiments of the present disclosure may include a touch display panel 110 provided with a plurality of touch sensors TS and a plurality of touch lines TL, and a touch driving circuit 120 configured to drive the touch sensors TS. In addition, the touch display device 100 may include a basic configuration for display driving, in addition to a configuration for touch sensing.

For example, a plurality of gate lines and a plurality of data lines may be disposed in the touch display panel 110, and a plurality of sub-pixels may be disposed at areas where gate lines and data lines intersect each other. The touch display panel 110 can be divided into an active area A/A where an image is displayed and a non-active area N/A, which is an outer area of the active area A/A.

Further, the touch display device 100 may include a gate driving circuit configured to drive the gate lines, a data driving circuit configured to drive the data lines, a controller configured to control the gate driving circuit and the data driving circuit, etc. That is, the touch display device 100 according to the embodiments of the present disclosure has a basic structure for display and may include a configuration for display driving and a configuration for touch sensing. In this specification, a description will be made focusing on the configuration for touch sensing.

The plurality of touch sensors TS may be disposed on the touch display panel 110 in the form of a separate touch panel or in the form embedded in the touch display panel 110. When the plurality of touch sensors TS are disposed in the form embedded in the touch display panel 110, the plurality of touch sensors TS may be electrodes used for display driving, or may be electrodes separately disposed for touch sensing.

For example, when the touch display device 100 is a liquid crystal display device, a common electrode disposed on the touch display panel 110 can be used as a touch sensor TS. That is, the common electrode receives a common voltage during a display driving period and receives a touch driving signal during a touch sensing period so as to serve as a touch sensor TS for touch sensing.

When the touch display device 100 is an organic light emitting display device, a plurality of touch sensors TS can be disposed on an encapsulation layer ENCAP in the touch display panel 110. Accordingly, it is possible to overcome the problem that makes it difficult to form the touch sensors TS, which are made of a metal material, inside the panel due to an organic material, and to provide a touch sensing function in the organic light-emitting display device.

Hereinafter, the embodiments of the present disclosure will be described focusing on when the touch display device 100 is an organic light-emitting display device, but the embodiments of the present disclosure are not limited thereto.

The plurality of touch sensors TS may be a transparent electrode, a mesh-shaped electrode, or the like. In addition, the plurality of touch sensors TS may be disposed in various structures depending on a touch sensing method. For example, the plurality of touch sensors TS can be disposed on the touch display panel 110 in a separated form, and each touch sensor TS can be connected to one touch line TL. Then, the plurality of touch sensors TS can sense a touch by sensing a change in self-capacitance caused by a user's touch (self-capacitance sensing method).

Alternatively, the plurality of touch sensors TS may include first touch sensors TS1 and second touch sensors TS2 to which voltages of different levels are applied. In addition, the plurality of touch sensors TS can sense a touch by sensing a change in mutual capacitance between the first touch sensors TS1 and the second touch sensors TS2, which is caused at the time of touching by the user (mutual-capacitance sensing method).

When a touch is sensed by the mutual-capacitance sensing method, the plurality of first touch sensors TS1 can be connected and arranged in one direction. In addition, the plurality of second touch sensors TS2 can be connected to each other and arranged in a direction intersecting the direction in which the first touch sensors TS1 are arranged. The first touch sensors TS1 may be connected to a first touch line TL1 and the second touch sensors TS2 may be connected to a second touch line TL2.

In the touch sensing period, voltages of different levels are applied through the first touch line TL1 and the second touch line TL2, and when the user touches the touch panel a change in capacitance occurs between the first touch sensors TS1 and the second touch sensors TS2. Further, the touch driving circuit 120 drives the first touch sensors TS1 and the second touch sensors TS2 in the touch sensing period and senses a change in capacitance between the first touch sensors TS1 and the second touch sensors TS2.

The touch driving circuit 120 converts a sensed value into digital data and transmits the converted digital data to a touch controller, so that the touch controller can detect the presence or absence of the touch and the touch position using the digital data. In addition, the touch driving circuit 120 can be configured separately from the data driving circuit for driving the data lines, or may be configured in a single chip form.

Figure 2:
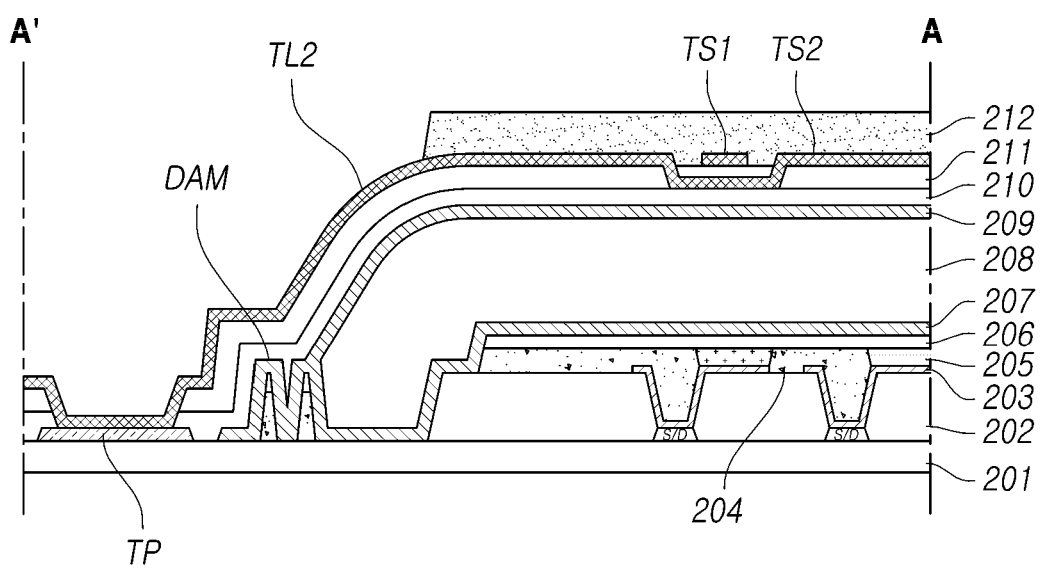
FIG. 2 is a view illustrating an example of a cross section taken along line A-A' in FIG. 1 when the touch display device illustrated in FIG. 1 is an organic light-emitting display device.

FIG. 2 illustrates an example of a cross section taken along line A-A' in the touch display device 100 illustrated in FIG. 1, and illustrates an area adjacent to a portion where the touch sensors TS and the touch driving circuit 120 are connected to each other. Referring to FIG. 2, source/drain electrodes S/D for display driving are disposed on a polyimide layer 201. In addition, a touch pad TP to which a touch line TL is connected may be disposed. The touch pad TP may be made of the same material as the source/drain electrodes S/D.

A first flattening layer 202 is disposed on the source/drain electrodes S/D and contact holes are formed in the first flattening layer 202 in the portions corresponding to the source/drain electrodes S/D. A first electrode layer 203 is disposed on the first flattening layer 202, and the first electrode layer 203 is connected to the source/drain electrodes S/D through contact holes formed in the first flattening layer 202. Here, the first electrode layer 203 may be an anode.

Further, an organic light-emitting layer 205 is disposed on the first electrode layer 203 and a bank layer 204 is disposed on an area where the organic light emitting layer 205 is not disposed. Also, a second electrode layer 206 is disposed on the organic light-emitting layer 205, and the second electrode layer 206 may be a cathode.

A first protection layer 207, a second protection layer 208 and a third protection layer 209 may be laminated on the second electrode layer 206. Here, the first protection layer 207, the second protection layer 208, and the third protection layer 209 may be considered to constitute one encapsulation layer ENCAP. Such an encapsulation layer ENCAP may form a dam (DAM) having a predetermined height to prevent collapse at an inclined portion.

A structure for touch sensing may also be formed on the basic structure for display driving. In addition, a touch buffer layer 210 is disposed on the encapsulation layer ENCAP and a touch insulating layer 211 is disposed on the touch buffer layer 210. Further, the touch sensors TS and the touch lines TL are disposed on the touch insulating layer 211 and the second flattening layer 212 is disposed on the touch sensors TS and the touch lines TL. The second flattening layer 212 may be an overcoat layer OC.

When the touch sensors TS are arranged in a structure for the mutual-capacitance sensing method, a portion where the first touch sensors TS1 are connected to each other and a portion where the second touch sensors TS2 are connected to each other intersect each other. As illustrated in FIG. 2, the second touch sensors TS2 may be configured to be connected to each other through a metal disposed below the touch insulation layer 211. As described above, by providing the structure in which the touch sensors TS and the touch lines TL are disposed on the encapsulation layer ENCAP in the organic light-emitting display device, it is possible to easily form a configuration for touch sensing in the panel.

Also, when a White Organic Light Emitting Diode (W-OLED) is used in the organic light-emitting display device capable of touch sensing, a color filter CF can be disposed on the encapsulation layer ENCAP. In particular, FIGS. 3 and 4 illustrates examples of a cross-sectional structure in which the touch sensors TS and the color filters CF are disposed on the encapsulation layer ENCAP.

Figure 3:
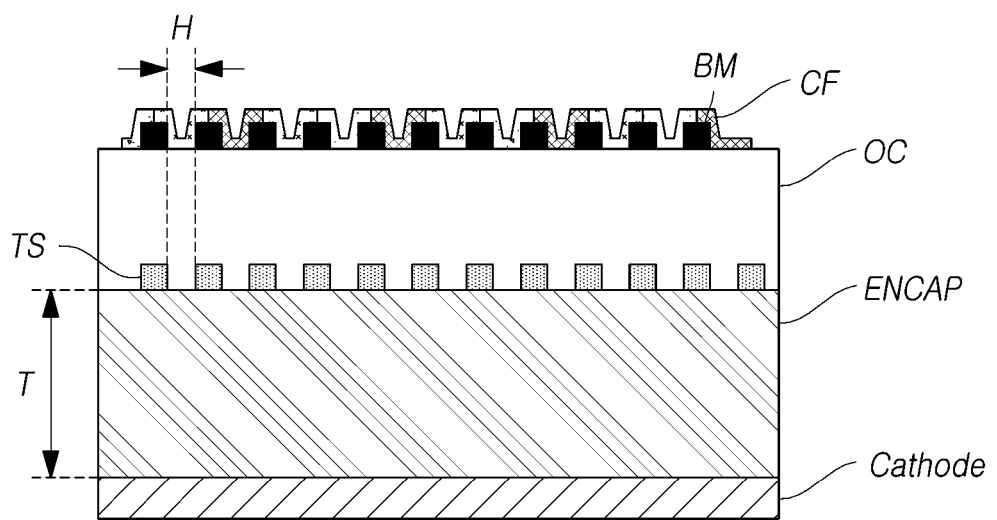
FIGS. 3 and 4 are views illustrating examples of a schematic structure in which touch sensors are disposed when the touch display device according to the embodiments of the present disclosure is an organic light-emitting display device.
Figure 4:
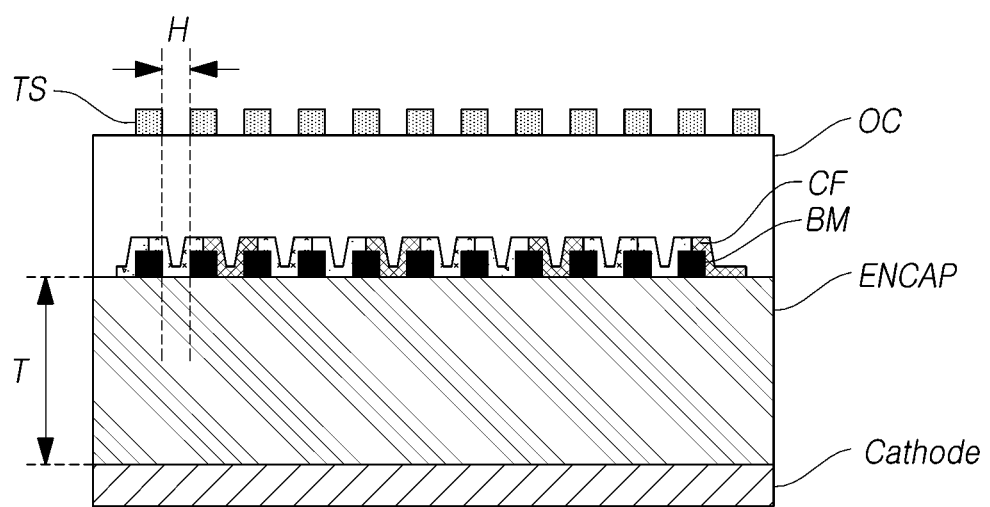

Referring to FIGS. 3 and 4, an encapsulation layer ENCAP can be disposed on the cathode (Cathode), and the touch sensors TS can be disposed on the encapsulation layer ENCAP. Here, by forming the encapsulation layer ENCAP to have a thickness T of a predetermined level or more (e.g., 5 μm or more), it is possible to reduce a parasitic capacitance formed between the cathode (Cathode) and the touch sensors TS. Therefore, deterioration of touch sensing sensitivity due to the parasitic capacitance can be prevented.

In addition, the touch sensors TS may be transparent electrodes or mesh-type electrodes. When the touch sensors TS are mesh-type sensors including holes H, the holes H can be located corresponding to light-emitting areas of the sub-pixels. By making the holes H included in the touch sensors TS correspond to the light-emitting areas of sub-pixels, touch sensing can be performed without deteriorating the light-emitting performance of the organic light-emitting display device.

Further, the color filters CF are disposed on the encapsulation layer ENCAP and the vertical positions of the color filters CF and the touch sensors TS can be variously designed. For example, as illustrated in FIG. 3, the color filters CF and a black matrix BM can be disposed on the touch sensors TS. In addition, the color filters CF and the black matrix BM can be disposed on the overcoat layer OC disposed on the touch sensors TS.

For example, as illustrated in FIG. 4, the color filters CF and the black matrix BM can be disposed under the touch sensors TS. In addition, the touch sensors TS can be disposed on the overcoat layer OC disposed on the color filters CF and the black matrix BM. That is, the touch sensors TS and the color filters CF can be designed to have an optimal positional relationship in consideration of touch performance and display performance.

Therefore, the embodiments of the present disclosure overcome the difficulties of forming touch sensors TS inside a panel in an organic light-emitting display device and enable touch sensing without deteriorating display performance. Further, the touch display device 100 can sense a touch through the self-capacitance sensing method or the mutual-capacitance sensing method. Alternatively, the self-capacitance sensing method and the mutual-capacitance sensing method can be performed in combination so as to sense a touch.

When a touch is sensed by the mutual-capacitance sensing method, signals having different voltage levels are applied to adjacent touch sensor TS, so that a repulsive force may increase due to the charges concentrated to the portion where an electric field is formed. In addition, due to the increase of the repulsive force, the touch sensors TS can be damaged.

Figure 5:
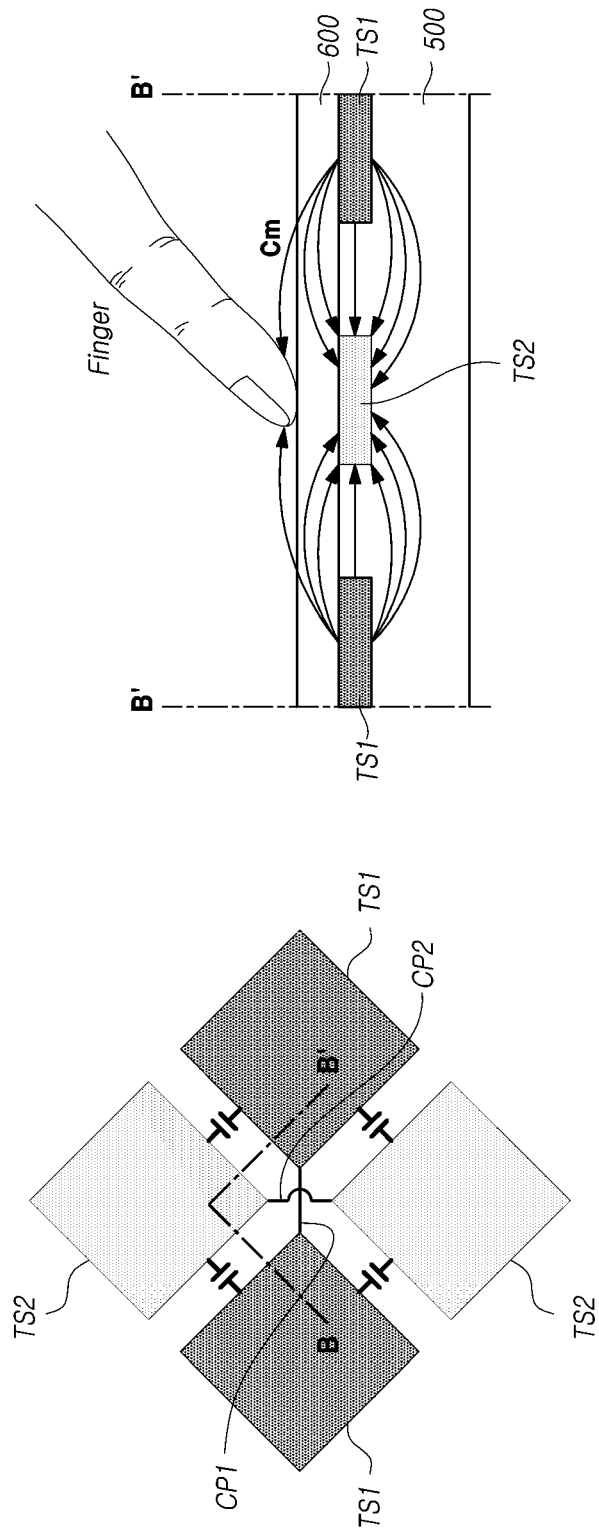
FIG. 5 is a view illustrating an example of a structure for sensing a touch using mutual capacitance in a touch display device according to the embodiments of the present disclosure.
Figure 6:
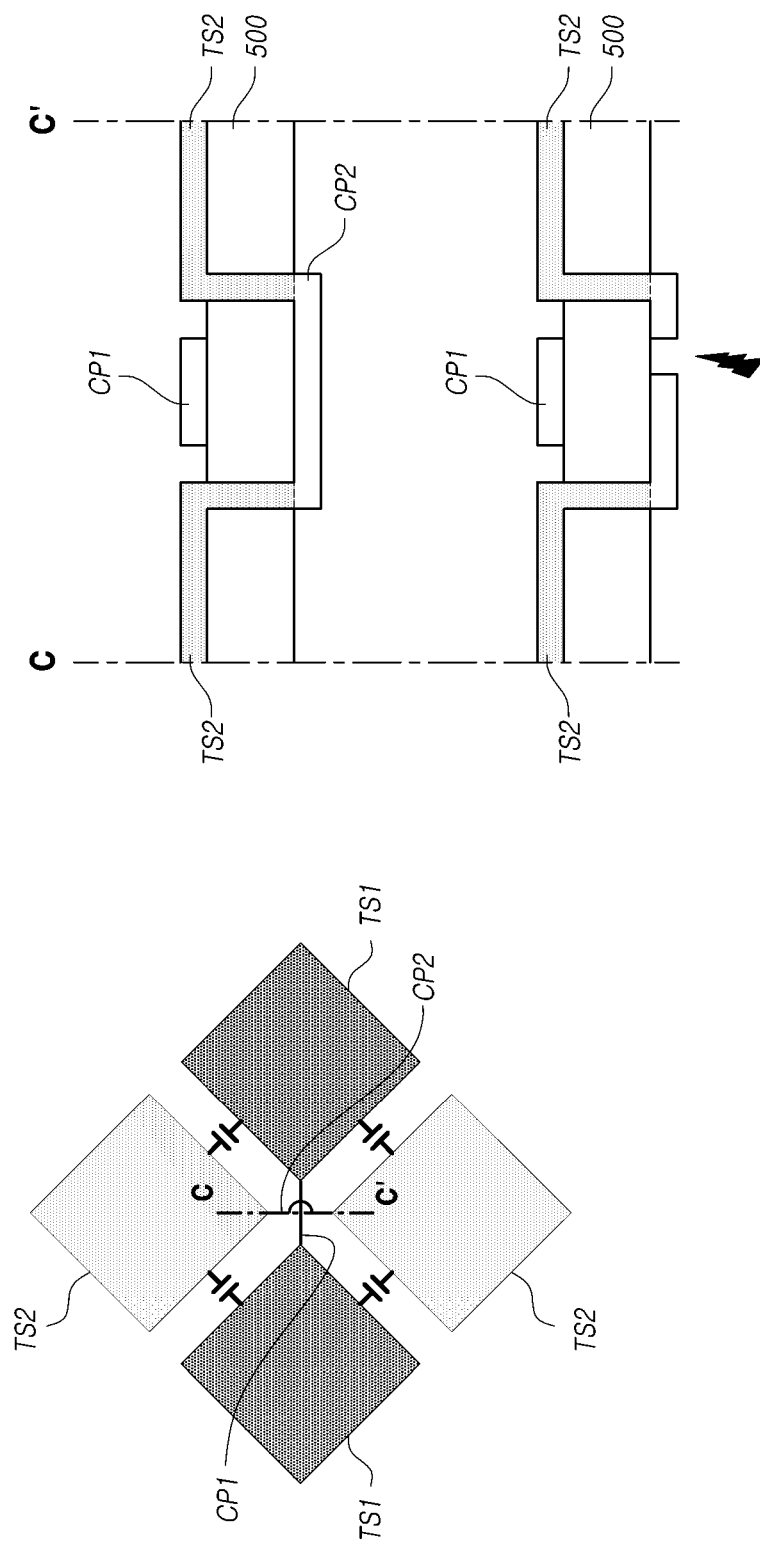
FIG. 6 is a view illustrating an example of when a touch sensor is damaged due to a charge concentration phenomenon in a touch display device according to the embodiments of the present disclosure.

In more detail, FIG. 5 illustrates an example of a structure for sensing a touch by the mutual-capacitance sensing method, and FIG. 6 illustrates an example of when touch sensors are damaged in the touch sensor TS structure illustrated in FIG. 5. Referring to FIG. 5, the touch sensors TS in the touch display device 100 according to the embodiments of the present disclosure may include first touch sensors TS1 and second touch sensors TS2 to which signals having different voltage levels are applied in the touch sensing period.

The first touch sensors TS1 can be arranged in the X-axis direction while being connected to each other through a first connection pattern CP1. Also, the second touch sensors TS2 can be arranged in the Y-axis direction while being connected to each other through a second connection pattern CP2. Here, the first connection pattern CP1 and the second connection pattern CP2 can intersect each other, and any one of the first connection pattern CP1 and the second connection pattern CP2 can be connected through a pattern disposed in another layer at the intersection point.

In addition, the first touch sensors TS1 and the second touch sensors TS2 form an electric field with respect to each other, and a mutual electrostatic capacitance changes when the user touches them. The touch can thus be sensed by sensing the change in mutual capacitance. Also, the first touch sensors TS1 and the second touch sensors TS2 receive touch driving signals having different voltage levels and form an electric field, causing a phenomenon in which charges are concentrated to a specific area.

For example, the charge concentration phenomenon may occur at a portion where the first connection pattern CP1 and the second connection pattern CP2 overlap each other. Referring to FIG. 6, the first connection pattern CP1 is disposed on the same layer as the first touch sensors TS1 and connects adjacent first touch sensors TS1. In addition, the second connection pattern CP2 is disposed on a layer different from the second touch sensors TS2 and connects adjacent second touch sensors TS2.

Therefore, the first connection pattern CP1 and the second connection pattern CP2 overlap each other at a point where the first connection pattern CP1 and the second connection pattern CP2 intersect each other. In addition, the first connection pattern CP1 and the second connection pattern CP2 are applied with signals of different voltage levels and have a small area compared to the touch sensors TS. Therefore, due to a charge-concentration phenomenon or a bottleneck phenomenon, the repulsive force between the first connection pattern CP1 and the second connection pattern CP2 may increase.

Accordingly, the first connection pattern CP1 or the second connection pattern CP2 may be damaged. In this instance, since the connection of the first touch sensors TS1 or the second touch sensors TS2 is cut off, the touch sensing cannot be performed, which results in a failure of the display device 100.

The embodiments of the present disclosure provide a touch sensor TS having an electrostatic discharge path and a touch display device 100 including such a touch sensor TS, so that the touch sensor TS can be prevented from being damaged in an area where a potential difference between signals applied for touch sensing occurs.

Figure 7:
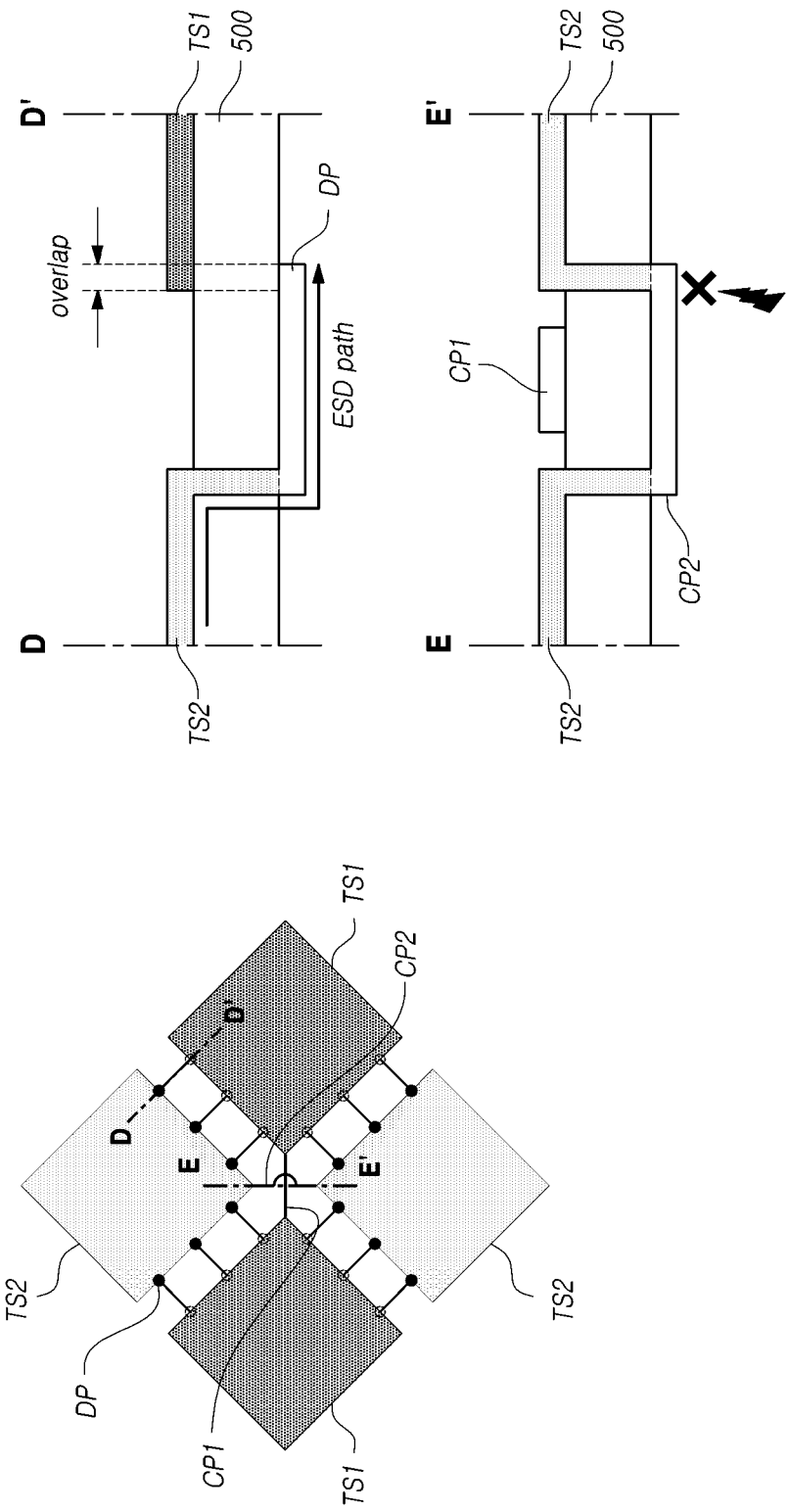
FIG. 7 is a view illustrating an example of a discharge pattern for providing an electrostatic discharge path of a touch sensor in a touch display device according to the embodiments of the present disclosure.

FIG. 7 illustrates an example of a touch sensor TS structure having an electrostatic discharge path in the touch display device 100 according to the embodiments of the present disclosure. Referring to FIG. 7, the touch sensors TS disposed in the touch display device 100 include first touch sensors TS1 and second touch sensors TS2 to which signals having different voltage levels are applied in a touch sensing period.

The first touch sensors TS1 may be arranged in the X-axis direction while being connected to each other through a first connection pattern CP1. That is, the first touch sensors TS1, connected to each other in the X-axis direction, can be arranged so as to form one group in the touch display panel 110.

Also, the second touch sensors TS2 may be arranged in the Y-axis direction while being connected to each other through a second connection pattern CP2. Likewise, the second touch sensors TS2, connected to each other in the Y-axis direction, can be arranged so as to form one group in the touch display panel 110.

The first connection pattern CP1 and the second connection pattern CP2 can also be disposed on the same layer as the layer on which the touch sensors TS are disposed or on a layer different from the layer on which the touch sensors TS are disposed. For example, the first connection pattern CP1 can be disposed on the same layer as the touch sensors TS, and the second connection pattern CP2 can be disposed under an insulating layer 500 located below the touch sensors TS.

When the first touch sensors TS1 and the first connection pattern CP1 are disposed on the same layer, at least two first touch sensors TS1 and at least one first connection pattern CP1, which are connected to each other, may be regarded as a "first touch metal." In addition, since the second touch sensors TS2 and the second connection pattern CP2 are disposed on different layers, each of the second touch sensors TS2 may be regarded as one "second touch metal."

The second connection pattern CP2 disposed under the insulating layer 500 can also be referred to as a "bridge metal." The first touch sensors TS1 or the second touch sensors TS2 can also connect to a discharge pattern DP that is formed to provide an electrostatic discharge path. Such a discharge pattern DP may be disposed on a layer different from the layer on which the touch sensors TS are disposed. For example, the discharge pattern DP can be disposed on the layer where the second connection pattern CP2, connecting the second touch sensors TS2, is disposed.

The discharge pattern DP can also be arranged so as to overlap an area where the first touch sensors TS1 and the second touch sensors TS2 form an electric field. That is, the discharge pattern DP can be disposed so as to overlap an area between the first touch sensor TS1 and the second touch sensor TS2.

One end of the discharge pattern DP may be connected to the first touch sensor TS1 or the second touch sensor TS2. Here, the discharge pattern DP may be connected to the outermost point of the first touch sensor TS1 or the outermost point of the second touch sensor TS2. The other end of the discharge pattern DP that is not connected to a touch sensor can overlap another touch sensor TS.

For example, when one end of the discharge pattern DP is connected to the first touch sensor TS1, the other end of the discharge pattern DP can overlap the second touch sensor TS2. In addition, when one end of the discharge pattern DP is connected to the second touch sensor TS2, the other end of the discharge pattern DP can overlap the first touch sensor TS1.

That is, the discharge pattern DP is connected to the touch sensor and has a structure in which one end is connected to the first touch sensor TS1 or the second touch sensor TS2 and the other end is not connected to the touch sensors TS. The other end of the discharge pattern DP, which is not connected to the touch sensors TS, is disposed to overlap a touch sensor TS to which a signal having a voltage level, which is different from that of a signal applied to the touch sensor TS to which the discharge pattern DP is connected, is applied.

Accordingly, the discharge pattern DP connected to the first touch sensor TS1 overlaps the second touch sensor TS2. Also, the discharge pattern DP connected to the second touch sensor TS2 overlaps the first touch sensor TS1.

Since the discharge pattern DP connected to the first touch sensor TS1 overlaps the second touch sensor TS2, an electric field can be formed between the discharge pattern DP and the second touch sensor TS2. Likewise, since the discharge pattern DP connected to the second touch sensor TS2 overlaps the first touch sensor TS1, an electric field can be formed between the discharge pattern DP and the first touch sensor TS1. Thus, charges can be concentrated to the discharge pattern DP. Then, the discharge pattern DP can serve as an electrostatic discharge path.

When the first touch sensor TS1 and the discharge pattern DP are connected to each other, since charges are concentrated to the discharge pattern DP connected to the first touch sensor TS1, a repulsive force increases in the area where the discharge pattern DP and the second touch sensor TS2 are overlapped with each other.

Therefore, when a touch driving signal is applied to the first touch sensor TS1 and the second touch sensor TS2 in the touch sensing period, the repulsive force increases in the area where the discharge pattern DP overlaps the touch sensor TS. Thus, the discharge pattern DP may be damaged due to the increase in repulsive force. That is, by making the discharge pattern DP form the charge-concentration area, it is possible to prevent either the touch sensor TS or the connection pattern CP from being damaged due to the charge concentration.

In addition, by forming the discharge pattern DP on the layer where the second connection pattern CP2 connecting the second touch sensors TS2 is disposed, the discharge pattern DP can be easily formed. Since the discharge pattern DP is formed using the bridge metal forming the second connection pattern CP2, the discharge pattern DP can be formed through a process of forming the second connection pattern CP2.

Therefore, in the layer where the bridge metal is disposed, a portion of the bridge metal (a connection pattern) is connected to two touch sensors TS and the remaining bridge metal (a discharge pattern) is only connected to any one of the touch sensors TS.

Referring to the cross section taken along line D-D' in FIG. 7 in which the discharge pattern DP is disposed, the discharge pattern DP is disposed under the insulating layer 500 disposed under the touch sensors TS. One end of the discharge pattern DP is connected to the second touch sensor TS2, and the other end of the discharge pattern DP overlaps the first touch sensor TS1.

When a touch driving signal is applied to the first touch sensor TS1 and the second touch sensor TS2, the discharge pattern DP becomes an area where charges are concentrated from the first touch sensor TS1. Therefore, the discharge pattern DP constitutes the electrostatic discharge path. In addition, even if the repulsive force increases due to charge concentration, damage may occur in the discharge pattern DP.

Therefore, referring to the cross section taken along line E-E' in FIG. 7 where the first connection pattern CP1 and the second connection pattern CP2 intersect each other, it is possible to prevent the second connection pattern CP2 from being damaged due to the charge concentration. Meanwhile, such a discharge pattern DP can be disposed with a thickness smaller than that of the touch sensors TS or the connection patterns CP.

Figure 8:
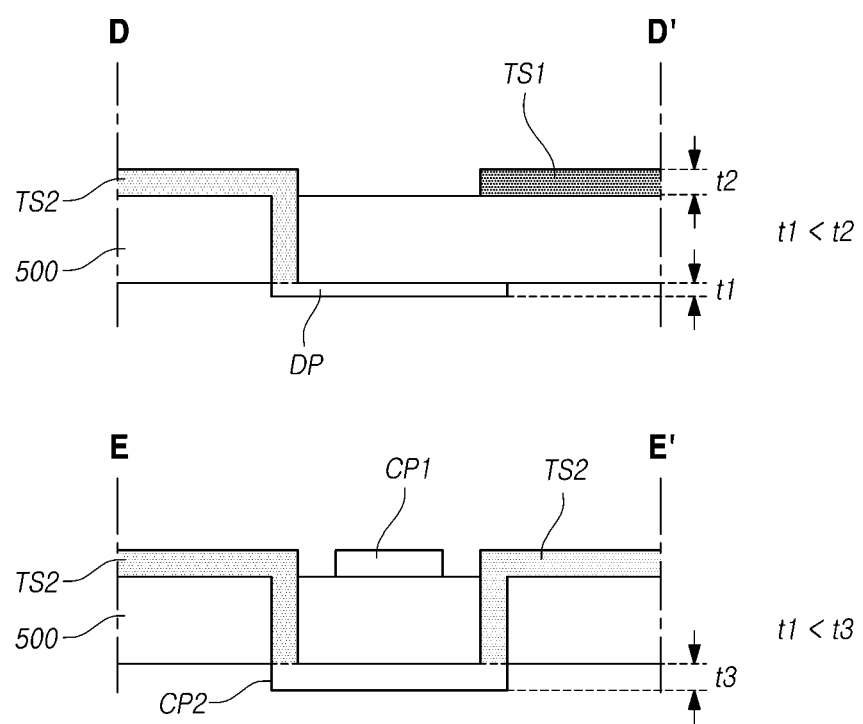
FIG. 8 is a view illustrating another example of the discharge pattern illustrated in FIG. 7.

FIG. 8 illustrates another example of the structure of the discharge pattern DP illustrated in FIG. 7, in which examples of a cross section taken along line D-D' and a cross section taken along line E-E' in FIG. 7. Referring to FIG. 8, the discharge pattern DP can be disposed on a layer different from the layer on which the touch sensors TS are disposed, and can be disposed such that one end thereof is connected to the second touch sensor TS2 and the other end overlaps the first touch sensor TS1.

Here, the thickness t1 of the discharge pattern DP is smaller than the thickness t2 of the touch sensor TS. Alternatively, the thickness t1 of the discharge pattern DP may be smaller than the thickness t3 of the connection pattern CP. In order to improve the electrostatic discharge performance of the discharge pattern DP, the degree of charge concentration to the discharge pattern DP should be increased. In order to increase the degree of charge concentration, the charge density in the discharge pattern DP should be increased.

Thus, in order to design the charge concentration area by increasing the charge density, the thickness of the discharge pattern DP can be made smaller than the thickness of the touch sensors TS or the connection pattern CP. For example, when the potentials at two specific points 1 and 2 on a conductor surface are V1 and V2, V1 and V2 are equal to each other (V1=V2).

$$\text{Since } V = k \cdot \frac{Q}{R}, k \cdot \frac{Q1}{R1} = k \cdot \frac{Q2}{R2}.$$

Therefore, it can be seen that since Q1:Q2=R1:R2, charge amounts Q1 and Q2 at the two points 1 and 2 are respectively proportional to the curvature radii R1 and R2 at the two points 1 and 2.

Here, assuming charge densities at the two points 1 and 2 are σ1 and σ2, since $$Q = 4\pi R^2 \sigma, k \cdot \frac{4\pi R1^2 \sigma 1}{R1} = k \cdot \frac{4\pi R2^2 \sigma 2}{R2}.$$

Accordingly, since σ1:σ2=R2:R1, it can be seen that the charge density is increased as the curvature radius is decreased. Therefore, by reducing the thickness of the discharge pattern DP connected to the touch sensors TS, it is possible to make the charge density of the discharge pattern DP larger than the charge density of the touch sensors TS.

In addition, by making the degree of charge concentration to the discharge pattern DP increase through the structure, in which the electric charge density formed in the discharge pattern DP is large, it is possible to enhance the functions of the discharge pattern DP as an area in which an electrostatic discharge path is provided and damage may occur. The discharge pattern DP can also be applied to when the touch sensors TS have various structures.

Figure 9:
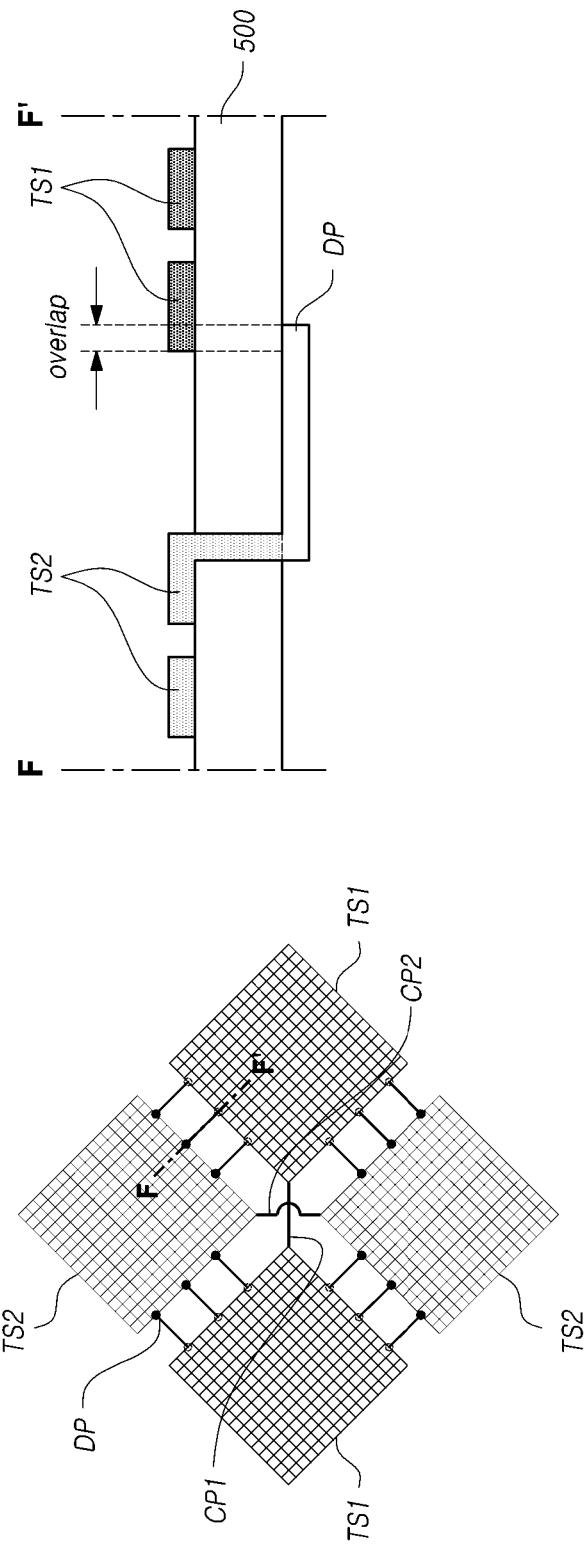
FIGS. 9 to 11 are views each illustrating an example of a discharge pattern formed in a structure in which touch sensors are of a mesh type in a touch display device according to the embodiments of the present disclosure.

Next, FIG. 9 illustrates an example of a discharge pattern DP formed in a structure, in which touch sensors TS disposed in the touch display device 100 are mesh-type touch sensors. Referring to FIG. 9, first touch sensors TS1 is connected in the X-axis direction through a first connection pattern CP1, and second touch sensors TS2 is connected in the Y-axis direction through a second connection pattern CP2. The first touch sensors TS1 and the second touch sensors TS2 are also arranged in a mesh type.

In addition, a discharge pattern DP is connected to the outermost point of the first touch sensors TS1 or the second touch sensors TS2, and is disposed on a layer different from the layer on which the touch sensors TS are disposed. As shown, one end of the discharge pattern DP is connected to the first touch sensor TS1 or the second touch sensor TS2 and the other end overlaps the second touch sensor TS2 or the first touch sensor TS1.

Referring to the cross section taken along line F-F' in FIG. 9, the discharge pattern DP is disposed under an insulating layer 500 disposed under the touch sensors TS. In addition, one end of the discharge pattern DP is connected to the second touch sensor TS2, and the other end of the discharge pattern DP is disposed to overlap the first touch sensor TS1.

Since the discharge pattern DP and the first touch sensor TS1 are overlapped with each other, an electric field is formed in the corresponding area and charges can be concentrated to the discharge pattern DP. Therefore, the discharge pattern DP functions as an electrostatic discharge path and when the charge concentration phenomenon is excessive, damage is induced to occur in the discharge pattern DP, thereby making it possible to prevent the touch sensors TS or the connection pattern CP from being damaged. Such mesh-type touch sensors TS may also include outer protruding portions so as to increase the capacitance formed between adjacent touch sensors TS.

Figure 10:
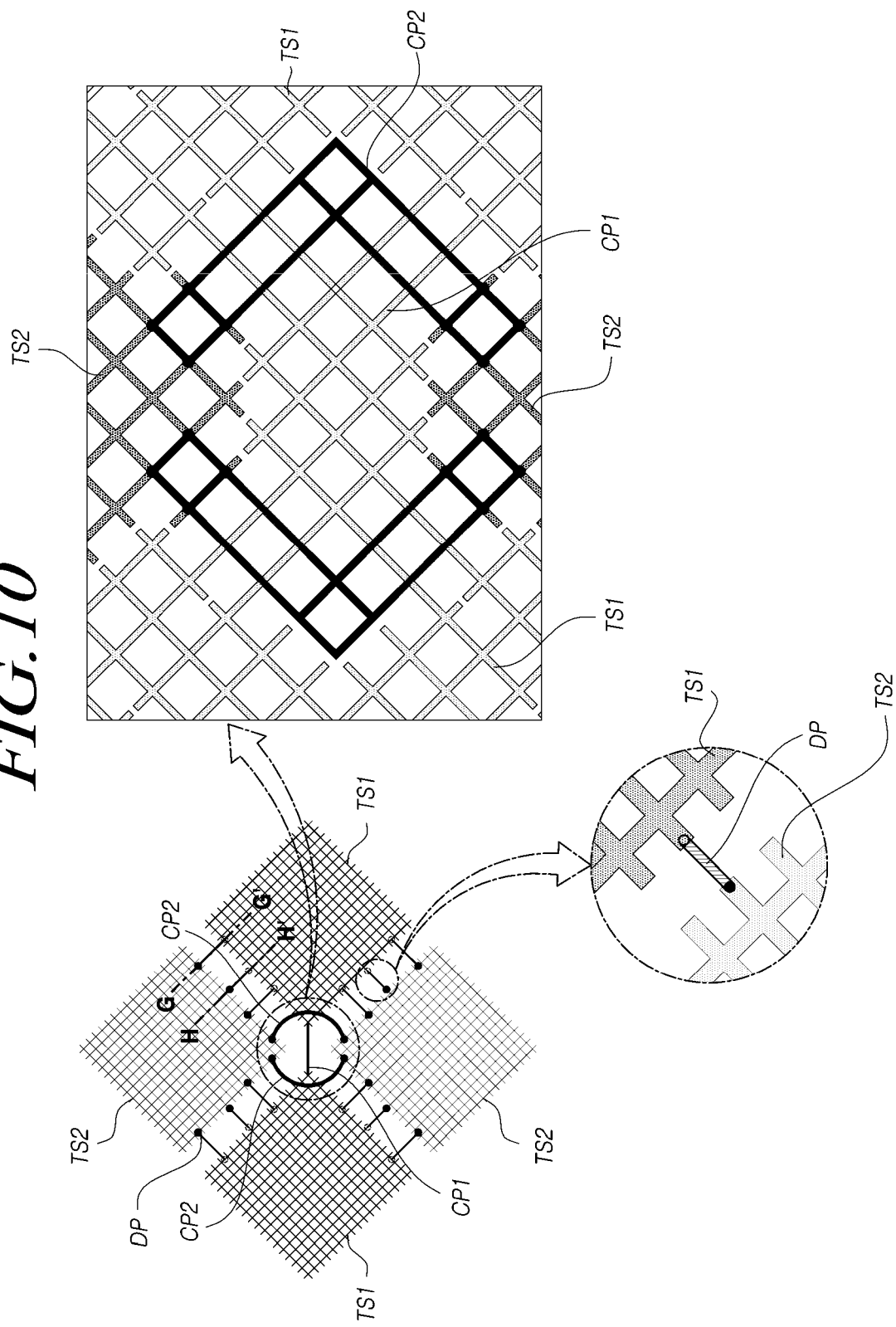
Figure 11:
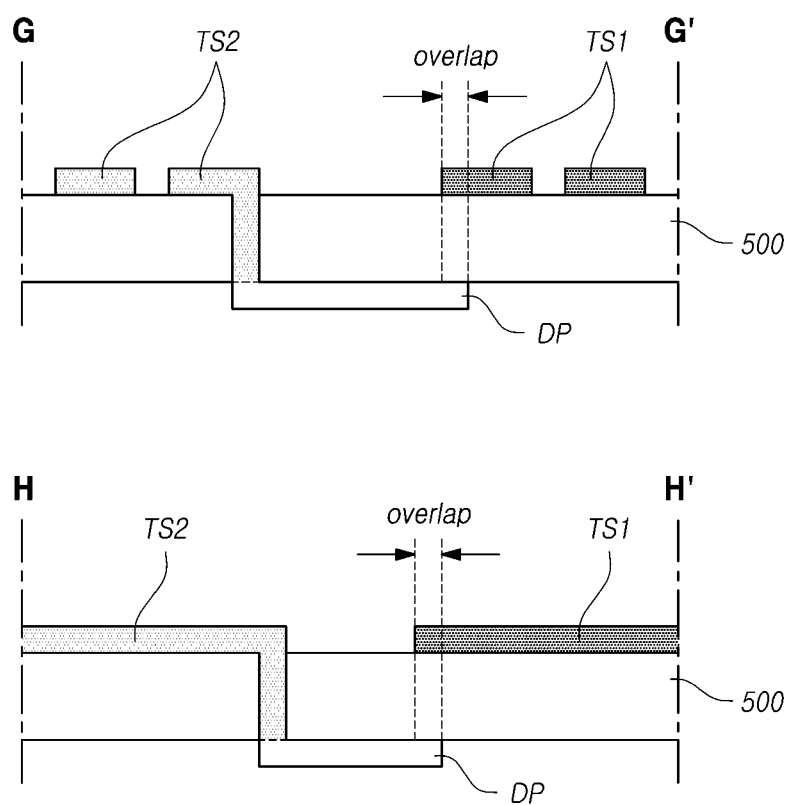

FIGS. 10 and 11 illustrate other examples of the discharge pattern DP formed in a structure, in which touch sensors TS disposed in the touch display device 100 are of a mesh type. Referring to FIG. 10, first touch sensors TS1 are connected in the X-axis direction through a first connection pattern CP1, and second touch sensors TS2 are connected in the Y-axis direction through a second connection pattern CP2.

The first touch sensor TS1 and the second touch sensor TS2 are a mesh type, and include outer protruding portions thereof. Since the first touch sensor TS1 and the second touch sensor TS2 include protruding portions and the distance between the touch sensors TS is reduced due to the protruding portions, the capacitance between the first touch sensor TS1 and the second touch sensor TS2 is increased, thereby improving touch sensing sensitivity.

The structure of the first touch sensor TS1 and the second touch sensor TS2 can be formed by forming a mesh-type touch metal and then removing the boundary portion between the first touch sensor TS1 and the second touch sensor TS2. Therefore, the protruding portions of the first touch sensor TS1 and the second touch sensor TS2 can be positioned in a straight line with each other.

In addition, the first connection pattern CP1 and the second connection pattern CP2 may also be formed in a mesh type, and there is a portion where the first connection pattern CP1 and the second connection pattern CP2 overlap each other. In order to prevent the first connection pattern CP1 and the second connection pattern CP2 from being damaged due to the charge concentration transfer at a portion where the first connection pattern CP1 and the second connection pattern CP2 are overlapped with each other as described above, a discharge pattern DP connected to the first touch sensor TS1 or the second touch sensor TS2 can be formed in the area between the first touch sensor TS1 and the second touch sensor TS2.

The discharge pattern DP is disposed on a layer different from the touch sensors TS, one end of the discharge pattern DP is connected to the first touch sensor TS1 or the second touch sensor TS2, and the other end of the discharge pattern DP is connected to the second touch sensor TS2 or the first touch sensor TS1. Further, the discharge pattern DP is connected to the outermost points of the first touch sensor TS1 and the second touch sensor TS2, and can be connected a protruding portion or a non-protruding portion at the outside of the first touch sensor TS1 or the second touch sensor TS2.

Next, FIG. 11 illustrates examples of a cross section taken along line G-G' where a discharge pattern DP is connected to a non-protruding outer portion of a touch sensor TS illustrated in FIG. 10 and a cross section taken along line H-H' where the discharge pattern DP is connected to a protruding outer portion of a touch sensor TS. Referring to the cross section taken along the line G-G' in FIG. 11, the discharge pattern DP disposed under the insulating layer 500 can be connected to a non-protruding outer portion of the second touch sensor TS2. In addition, the discharge pattern DP is disposed so as to overlap the first touch sensor TS1.

Referring to the cross section taken along line H-H' in FIG. 11, the discharge pattern DP disposed under the insulating layer 500 can be connected to a protruding outer portion of the second touch sensor TS2. Further, the discharge pattern DP is disposed to overlap the first touch sensor TS1. Therefore, by making mesh-type touch sensors TS include protruding portions, it is possible to provide a discharge path through a structure connected to the discharge pattern DP while improving touch sensing sensitivity by increasing capacitance formed between the touch sensors TS.

In addition, even if a portion where the first connection pattern CP1 and the second connection pattern CP2 overlap each other is increased, since charges are concentrated to the discharge pattern DP to induce damage in the discharge pattern DP, it is possible to prevent the touch sensors TS or the connection patterns CP from being damaged. In order to further increase the capacitance formed between the touch sensors TS, by dividing the boundary between the touch sensors TS in a shape similar to a gear wheel, rather than in a linear shape, it is possible to increase the number of points where the capacitance is formed.

Figure 12:
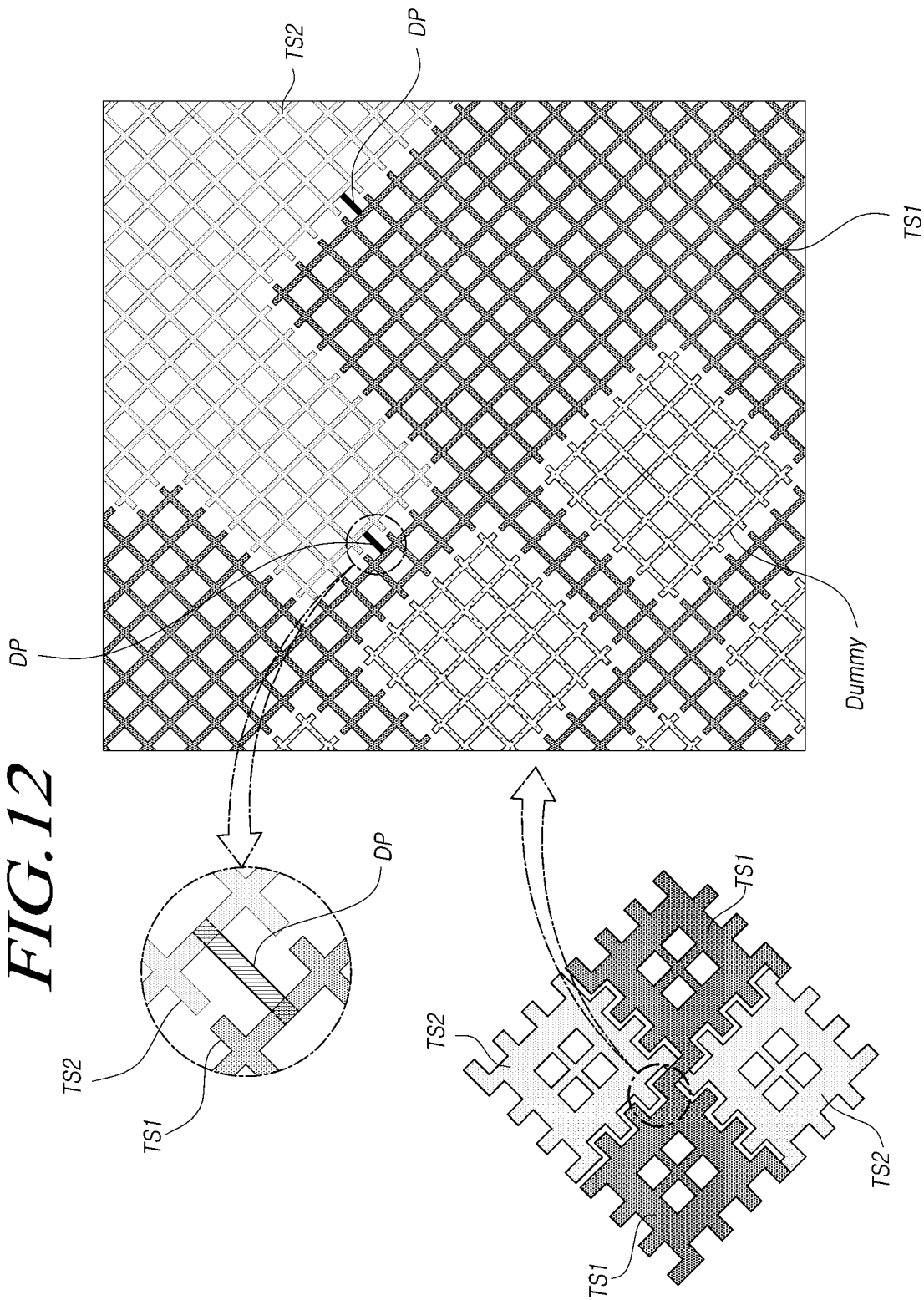
FIG. 12 is a view illustrating an example of a discharge pattern formed in a structure in which touch sensors are modified in a touch display device according to the embodiments of the present disclosure.

FIG. 12 illustrates an example of a discharge pattern DP formed in a structure, in which mesh-type touch sensors TS are modified in the touch display device 100 according to embodiments of the present disclosure. Referring to FIG. 12, first touch sensors TS1 are connected in the X-axis direction through a first connection pattern CP1, and second touch sensors TS2 are connected in the Y-axis direction through a second connection pattern CP2.

The first touch sensors TS1 and the second touch sensors TS2 are formed in a mesh type. Here, the boundary between the first touch sensor TS1 and the second touch sensor TS2 is formed in a zigzag shape instead of a linear shape, so that the boundary can have a shape similar to a gear wheel.

Therefore, compared to the structure in which the boundary between the first touch sensor TS1 and the second touch sensor TS2 is a straight line, the number of points where a capacitance is formed between the first touch sensor TS1 and the second touch sensor TS2 is increased, so that the touch sensing sensitivity can be further improved.

Here, a dummy pattern separated from a touch sensor TS may exist inside the touch sensor TS. Such a dummy pattern corresponds to a portion, which is separated from the touch sensor TS so as not to be applied with a signal. Further, the capacitance of each touch sensor TS can be adjusted by adjusting the presence or absence of a dummy pattern, the number of disposed dummy patterns, or the like.

Since the first touch sensor TS1 and the second touch sensor TS2 having such a modified structure also have a structure in which the first connection pattern CP1 and the second connection pattern CP2 overlap each other, a discharge pattern DP can be formed in the area between the first touch sensor TS1 and the second touch sensor TS2. The discharge pattern DP is disposed on a layer different from the first touch sensor TS1 and the second touch sensor TS2, and one end of the discharge pattern DP is connected to the first touch sensor TS1 or the second touch sensor TS2.

In addition, the other end of the discharge pattern DP is not connected to the touch sensors TS and is disposed so as to overlap the second touch sensor TS2 or the first touch sensor TS1. Therefore, a potential difference is generated between the discharge pattern DP and a touch sensor TS, which overlaps the discharge pattern DP, and charges are induced to be concentrated to the discharge pattern DP, so that the discharge pattern functions as the electrostatic discharge path. In addition, by causing charges to be concentrated to the discharge pattern DP, damage is induced to occur in the discharge pattern DP, so that it is possible to prevent the touch sensor TS or the connection pattern CP from being damaged.

According to the embodiments of the present disclosure, by forming a discharge pattern DP, which is connected to any one touch sensor TS between touch sensors having a potential difference and overlaps another touch sensor TS, static electricity can be discharged through the discharge pattern DP. In addition, by inducing charges to be concentrated to the discharge pattern DP so as to cause damage to occur in the discharge pattern DP, it is possible to prevent the touch sensor TS or the connection pattern CP from being damaged.

Further, the electrostatic discharge performance can be improved by adjusting the thickness of the discharge pattern DP, and the discharge pattern can be easily implemented by forming the discharge pattern DP on the layer where a bridge metal connecting touch sensors TS is disposed.

Although a preferred embodiment of the present disclosure has been described for illustrative purposes, those skilled in the art will appreciate that various modifications, additions and substitutions are possible, without departing from the scope and spirit of the disclosure as disclosed in the accompanying claims. Therefore, exemplary embodiments of the present disclosure have been described for the sake of brevity and clarity. The scope of the present disclosure shall be construed based on the accompanying claims so all of the technical ideas included within the scope equivalent to the claims belong to the present disclosure.

What is claimed is:

1. A display device comprising:
   a light-emitting device;
   an encapsulation layer disposed on the light-emitting device;
   an insulating layer on the encapsulation layer;
   a plurality of first touch sensors on an upper surface of the insulating layer, and arranged in a first direction;
   a plurality of second touch sensors on the upper surface of the insulating layer, and arranged in a second direction intersecting the first direction; and
   a discharge pattern disposed between the encapsulation layer and the insulating layer, and overlapping an area between a first touch sensor of the plurality of first touch sensors and a second touch sensor of the plurality of second touch sensors,
   wherein a first end of the discharge pattern is connected to one of the first touch sensor and the second touch sensor through a contact hole of the insulating layer,
   wherein a second end of the discharge pattern overlaps with at least a part of the other of the first touch sensor and the second touch sensor, and
   wherein the discharge pattern includes a first portion including the first end and passing through the contact hole of the insulating layer, and the first end is connected to an outermost point of the one of the first touch sensor and the second touch sensor.

2. The display device of claim 1, wherein the discharge pattern further includes a second portion including the second end and disposed along a lower portion of the insulating layer, and at least a part of the second portion overlaps with the at least a part of the other of the first touch sensor and the second touch sensor.

3. The display device of claim 1, further comprising:
   a first connection pattern on the upper surface of the insulating layer, and disposed between two first touch sensors of the plurality of first touch sensors to connect the two first touch sensors to each other; and
   a second connection pattern disposed between the encapsulation layer and the insulating layer, and disposed between two second touch sensors of the plurality of second touch sensors to connect the two second touch sensors to each other.

4. The display device of claim 3, wherein the first connection pattern, the plurality of first touch sensors, and the plurality of second touch sensors are disposed on a same layer.

5. The display device of claim 3, wherein the second connection pattern and the discharge pattern are disposed on a layer different from the first connection pattern, the plurality of first touch sensors, and the plurality of second touch sensors.

6. A display device comprising:
   a light-emitting device;
   an encapsulation layer disposed on the light-emitting device;

an insulating layer on the encapsulation layer;
a plurality of first touch sensors on an upper surface of the insulating layer, and arranged in a first direction;
a plurality of second touch sensors on the upper surface of the insulating layer, and arranged in a second direction intersecting the first direction; and
a discharge pattern disposed between the encapsulation layer and the insulating layer, and overlapping an area between a first touch sensor of the plurality of first touch sensors and a second touch sensor of the plurality of second touch sensors,
wherein a first end of the discharge pattern is connected to one of the first touch sensor and the second touch sensor through a contact hole of the insulating layer,
wherein the first touch sensor and the second touch sensor have a mesh type, and the first end of the discharge pattern is connected to one of a first protrusion protruding from a side of the first touch sensor and a second protrusion protruding from a side of the second touch sensor.

7. The display device of claim 6, further comprising:
a first connection pattern on the upper surface of the insulating layer, and disposed between two first touch sensors of the plurality of first touch sensors to connect the two first touch sensors to each other; and
a second connection pattern disposed between the encapsulation layer and the insulating layer, and disposed between two second touch sensors of the plurality of second touch sensors to connect the two second touch sensors to each other.

8. The display device of claim 7, wherein the first connection pattern, the plurality of first touch sensors, and the plurality of second touch sensors are disposed on a same layer.

9. The display device of claim 7, the second connection pattern and the discharge pattern are disposed on a layer different from the first connection pattern, the plurality of first touch sensors, and the plurality of second touch sensors.

* * * * *